US010304838B2

(12) United States Patent
Kim et al.

(10) Patent No.: US 10,304,838 B2
(45) Date of Patent: May 28, 2019

(54) SEMICONDUCTOR DEVICE

(71) Applicant: SAMSUNG ELECTRONICS CO., LTD., Suwon-si (KR)

(72) Inventors: Ye Ram Kim, Suwon-si (KR); Won Chul Lee, Seongnam-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 15 days.

(21) Appl. No.: 15/722,053

(22) Filed: Oct. 2, 2017

(65) Prior Publication Data
US 2018/0211962 A1 Jul. 26, 2018

(30) Foreign Application Priority Data

Jan. 24, 2017 (KR) ........................ 10-2017-0010941

(51) Int. Cl.
H01L 27/108 (2006.01)
H01L 29/94 (2006.01)
H01L 23/64 (2006.01)
H01L 21/768 (2006.01)
H01L 49/02 (2006.01)

(52) U.S. Cl.
CPC ...... H01L 27/10817 (2013.01); H01L 21/768 (2013.01); H01L 23/64 (2013.01); H01L 27/1085 (2013.01); H01L 28/87 (2013.01); H01L 28/91 (2013.01)

(58) Field of Classification Search
None
See application file for complete search history.

(56) References Cited

U.S. PATENT DOCUMENTS

| 8,951,914 | B2 | 2/2015 | Sako |
| 9,142,558 | B2 | 9/2015 | Yang et al. |
| 9,553,141 | B2 | 1/2017 | Yang et al. |
| 9,601,494 | B2 | 3/2017 | Kim et al. |
| 2014/0138794 | A1* | 5/2014 | Yang ................ H01L 27/10852 257/532 |
| 2016/0035731 | A1* | 2/2016 | Lee .................. H01L 27/10823 257/334 |

FOREIGN PATENT DOCUMENTS

KR 10-2014-0065186 A 5/2014
KR 10-2016-0019738 A 2/2016

* cited by examiner

Primary Examiner — Calvin Y Choi
(74) Attorney, Agent, or Firm — Sughrue Mion, PLLC

(57) ABSTRACT

A semiconductor device and method of manufacturing are provided. The semiconductor device includes a substrate; first and second structures spaced apart from each other on the substrate in a first direction, the first structure including a first lower electrode and the second structure including a second lower electrode; a first supporter pattern disposed on the substrate to support the first and second structures, and including a first region that exposes portions of sidewalls of the first and second structures, and a second region that covers a second portion of the sidewalls; and a second supporter pattern disposed on the first supporter pattern to support the first and second structures, the second supporter pattern including a third region, the third region configured to expose portions of the first sidewall and the second sidewall, and a fourth region that covers a portion of the first and second sidewalls.

20 Claims, 14 Drawing Sheets

SEMICONDUCTOR DEVICE

This application claims the priority from Korean Patent Application No. 10-2017-0010941, filed on Jan. 24, 2017, in the Korean Intellectual Property Office, the disclosure of which is incorporated herein by reference in its entirety.

BACKGROUND

1. Technical Field

Methods and apparatuses consistent with exemplary embodiments relate to a semiconductor device.

2. Related Art

Recently, as the integration of memory products accelerates in accordance with advances in semiconductor process technologies, the unit cell area thereof has been greatly reduced, and the operation voltage thereof has been lowered. For example, a semiconductor device, such as dynamic random-access memory (DRAM), must maintain or increase the necessary capacitance while reducing the area occupied by the semiconductor device, in accordance with the increased degree of integration of the semiconductor device. As the required capacitance increases, the aspect ratio of cylindrical lower electrodes becomes very large. Accordingly, there occurs a problem that the cylindrical lower electrodes collapse or break before dielectric deposition.

SUMMARY

Exemplary embodiments of the present inventive concept provide a semiconductor device, which can effectively support a lower electrode by allowing the size of an open region of a top supporter pattern to be greater than the size of an open region of a mid supporter pattern.

According to an aspect of an exemplary embodiment, there is provided a semiconductor device, including: a substrate; a first structure and a second structure spaced apart from each other on the substrate in a first direction, the first structure including a first lower electrode and the second structure including a second lower electrode; a first supporter pattern disposed on the substrate to support the first structure and the second structure, and including a first region that exposes a first portion of a first sidewall of the first structure and a second sidewall of the second structure, and a second region that covers a second portion of the first sidewall and the second sidewall; and a second supporter pattern disposed on the first supporter pattern to support the first structure and the second structure, the second supporter pattern including a third region, the third region configured to expose a third portion of the first sidewall and the second sidewall, and a fourth region that covers a fourth portion of the first sidewall and the second sidewall, wherein a first width of the first region of the first supporter pattern is smaller than a second width of the third region of the second supporter pattern.

According to an aspect of another exemplary embodiment, there is provided a semiconductor device, including: a substrate; a first structure disposed on the substrate and including a first lower electrode; a second structure spaced from the first structure on the substrate in a first direction and including a second lower electrode; a third structure spaced from the first structure on the substrate in a second direction different from the first direction and including a third lower electrode; a first supporter pattern disposed on the substrate to support the first structure, the second structure and the third structure, the first supporter pattern including a first region exposing first portions of sidewalls of the first structure, the second structure and the third structure and a second region that covers second portions of sidewalls of the first structure, the second structure and the third structure; and a second supporter pattern disposed on the first supporter pattern to support the first structure, the second structure and the third structure, the second supporter pattern including a third region exposing third portions of sidewalls of the first structure, the second structure and the third structure and a fourth region that covers fourth portions of sidewalls of the first structure, the second structure and the third structure, and the second supporter pattern containing a different material from the first supporter pattern, wherein a first length of a first supporter pattern sidewall disposed between the first structure and the second structure is different from a second length of a second supporter pattern sidewall disposed between the first structure and the second structure.

According to an aspect of yet another exemplary embodiment, there is provided a semiconductor device, including: a substrate; a first structure, a second structure and a third structure spaced apart from each other on the substrate, the first structure including a first lower electrode and the second structure including a second lower electrode and the third structure including a third lower electrode; a first supporter pattern disposed on the substrate to support the first structure, the second structure and the third structure, the first supporter pattern including a first region exposing first portions of sidewalls of the first structure, the second structure and the third structure; and a second supporter pattern disposed on the first supporter pattern to support the first structure, the second structure and the third structure, the second supporter pattern including a second region exposing second portions of sidewalls of the first structure, the second structure and the third structure, and the second supporter pattern containing a different material from the first supporter pattern, wherein a first width of the first region of the first supporter pattern is smaller than a second width of the second region of the second supporter pattern.

BRIEF DESCRIPTION OF THE DRAWINGS

The above and other aspects will become more apparent by describing exemplary embodiments in detail with reference to the attached drawings, in which.

DETAILED DESCRIPTION

Unless otherwise defined, the meaning of all terms including technical and scientific terms used herein is the same as that commonly understood by one of ordinary skill in the art. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Hereinafter, aspects of a semiconductor device consistent with one or more exemplary embodiments will be described with reference to FIG. 1 to FIG. 3.

Figure 1:
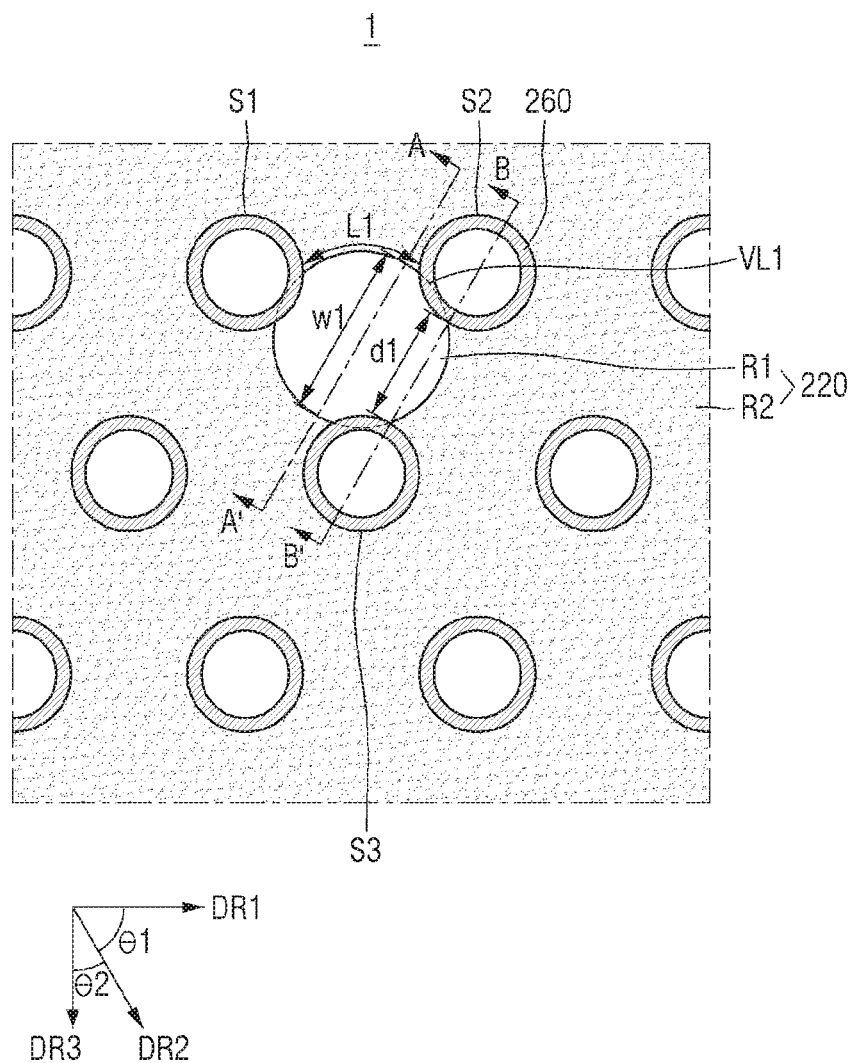
FIG. 1 is a view illustrating a mid supporter pattern of a semiconductor device according to an exemplary embodiment.

FIG. 1 is a view for illustrating the mid supporter pattern of a semiconductor device according to an exemplary embodiment. FIG. 2 is a view for illustrating the top supporter pattern of a semiconductor device according to an exemplary embodiment. FIG. 3 is a sectional view taken along the lines A-A' and B-B' of FIG. 1 and FIG. 2.

Figure 2:
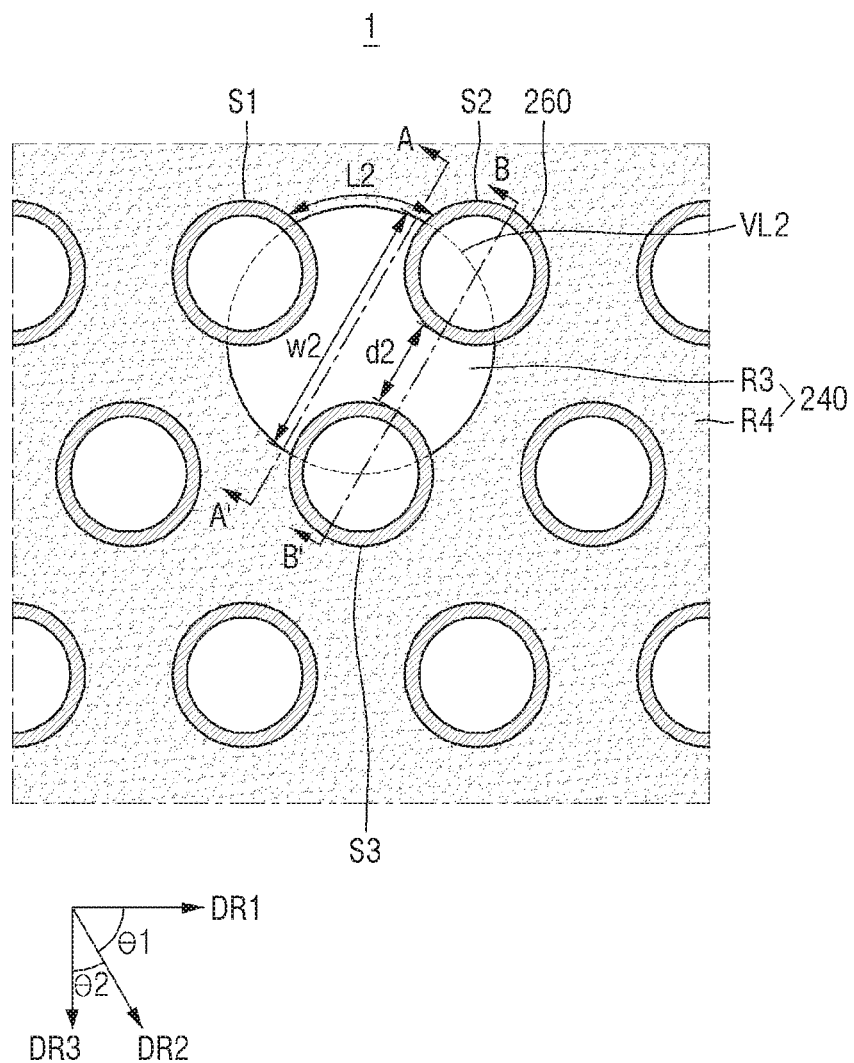
FIG. 2 is a view illustrating a top supporter pattern of a semiconductor device according to an exemplary embodiment.
Figure 3:
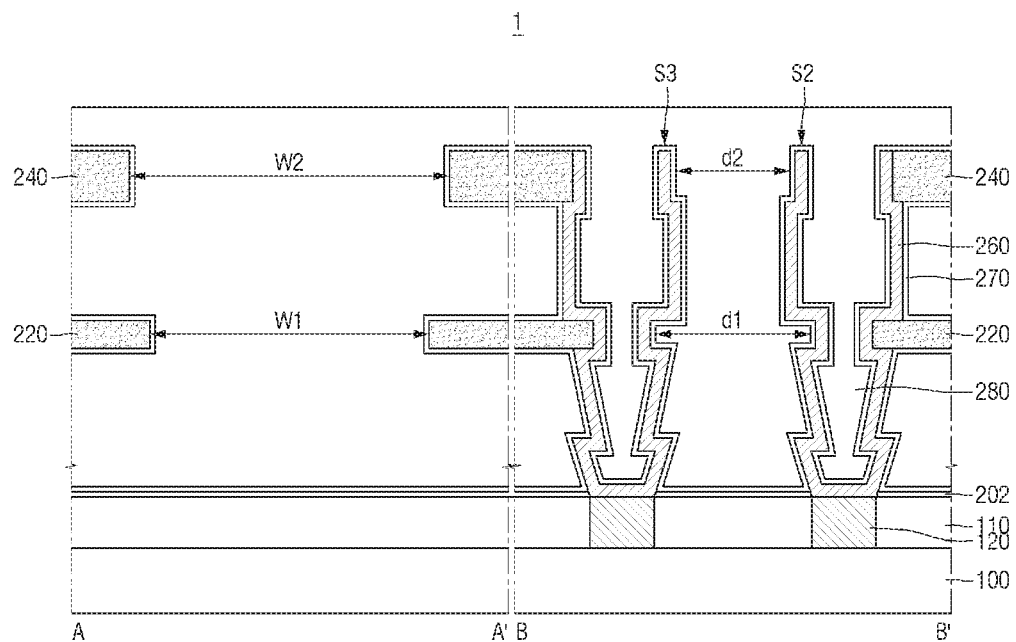
FIG. 3 is a sectional view taken along the lines A-A' and B-B' of FIG. 1 and FIG. 2.

Referring to FIG. 1 to FIG. 3, the semiconductor device 1 includes a substrate 100, an interlayer insulating film 110, a contact plug 120, an etching resistant film 202, a first supporter pattern 220, a second supporter pattern 240, a lower electrode 260, a capacitor dielectric film 270, and an upper electrode 280.

Referring to FIG. 1 and FIG. 2, the semiconductor device 1 may include a plurality of structures spaced apart from each other. For example, the first structure S1 and the second structure S2 may be spaced apart from each other in the first direction DR1. In addition, the third structure S3 may be disposed to be spaced apart from the first structure S1 in the second direction DR2.

The first angle θ1 formed by the first direction DR1 and the second direction DR2 may be an acute angle. For example, the angle θ1 formed by the first direction DR1 and the second direction DR2 may be 60°. In this case, the structures may be arranged at the vertices and center of a honeycomb-shaped hexagon.

Although it is shown in FIG. 1 and FIG. 2 that the respective structures are spaced from each other at equal distances, exemplary embodiments are not limited thereto. That is, in some other exemplary embodiments, at least one of the spaced distances between the respective structures may be different.

Each of the first to third structures S1, S2, and S3 may include a lower electrode 260 disposed along the inner wall of the structure (e.g., a first upper electrode, second upper electrode and third upper electrode), a capacitor dielectric film (270 of FIG. 3, e.g., a first capacitor dielectric film or second capacitor dielectric film) disposed on the lower electrode 260, and an upper electrode (280 of FIG. 3) disposed on the capacitor dielectric film (270 of FIG. 3). However, in FIG. 1 and FIG. 2, the capacitor dielectric film (270 of FIG. 3) and the upper electrode (280 of FIG. 3) are omitted for convenience of explanation.

The plurality of supporter patterns may support respective structures. Specifically, referring to FIG. 1, a mid supporter pattern, that is, the first supporter pattern 220, may be disposed on the substrate 100 to support the first to third structures S1, S2, and S3. Further, the first supporter pattern 220 may include a first region R1 exposing a part of the sidewall of each of the first to third structures S1, S2, and S3, and a second region R2 surrounding the remaining part of the sidewall of each of the first to third structures S1, S2, and S3. Accordingly, the first supporter pattern 220 may support the first to third structures S1, S2, and S3. Parts or portions may be referred to, for example, as first portions of sidewalls, second portions of sidewalls, third portions of sidewalls, fourth portions of sidewalls, fifth portions of sidewalls, sixth portions of sidewalls, etc. Further, sidewalls may be referred to as a first sidewall, a second sidewall, a third sidewall, a fourth sidewall, etc.

Although it is shown in FIG. 1 that the first region R1 of the first supporter pattern 220 is formed only between the first to third structures S1, S2, and S3, this is for the convenience of explanation, and exemplary embodiments are not limited thereto. That is, the first region R1 of the first supporter pattern 220, may also be formed between adjacent structures.

The first region R1 of the first supporter pattern 220 may have a circular shape. Specifically, the sidewall of the second region R2 of the first supporter pattern 220 may be formed along a first imaginary circular line VL1 having a circular shape. However, exemplary embodiments are not limited thereto. That is, in some other exemplary embodiments, the first region R1 of the first supporter pattern 220 may have, for example, a rectangular or parallelogram shape.

Referring to FIG. 2, a top supporter pattern, that is, the second supporter pattern 240, may be disposed on the first supporter pattern 220 to support the first to third structures S1, S2, and S3. Further, the second supporter pattern 240 may include a third region R3 exposing a part of the sidewall of each of the first to third structures S1, S2, and S3, and a fourth region R4 surrounding the remaining part of the sidewall of each of the first to third structures S1, S2, and S3. Accordingly, the second supporter pattern 240 may support the first to third structures S1, S2, and S3.

Although it is shown in FIG. 2 that the third region R3 of the second supporter pattern 240 is formed only between the first to third structures S1, S2, and S3, this is for the convenience of explanation, and exemplary embodiments are not limited thereto. That is, the third region R3 of the second supporter pattern 240, may also be formed between adjacent structures.

The third region R3 of the second supporter pattern 240 may have a circular shape. Specifically, the sidewall of the fourth region R4 of the second supporter pattern 240 may be formed along a second imaginary circular line VL2 having a circular shape. However, exemplary embodiments are not limited thereto. That is, in some other exemplary embodiments, the third region R3 of the second supporter pattern 240 may have, for example, a rectangular or parallelogram shape.

The first supporter pattern 220 and the second supporter pattern 240 include different materials. For example, the first supporter pattern 220 may contain SiCN, and the second supporter pattern 240 may contain SiN.

In this case, in the process of respectively etching a first mold film (210 of FIG. 4) disposed between the substrate 100 and a first supporter film (222 of FIG. 4) and containing an oxide and a second mold film (230 of FIG. 4) disposed between the first supporter film (222 of FIG. 4) and a second supporter film (242 of FIG. 4) and containing an oxide, a part of the second supporter film (242 of FIG. 4) containing SiN may be etched.

Thus, the first width w1 of the first region R1 of the first supporter pattern 220 is formed to be smaller than the second width w2 of the third region R3 of the second supporter pattern 240. That is, the first diameter w1 of the first imaginary line VL1 is formed to be smaller than the second diameter w2 of the second imaginary line VL2.

As a result, a portion of each of the structures surrounded by the first supporter pattern 220 increases, so as to effectively support each of the structures.

Figure 4:
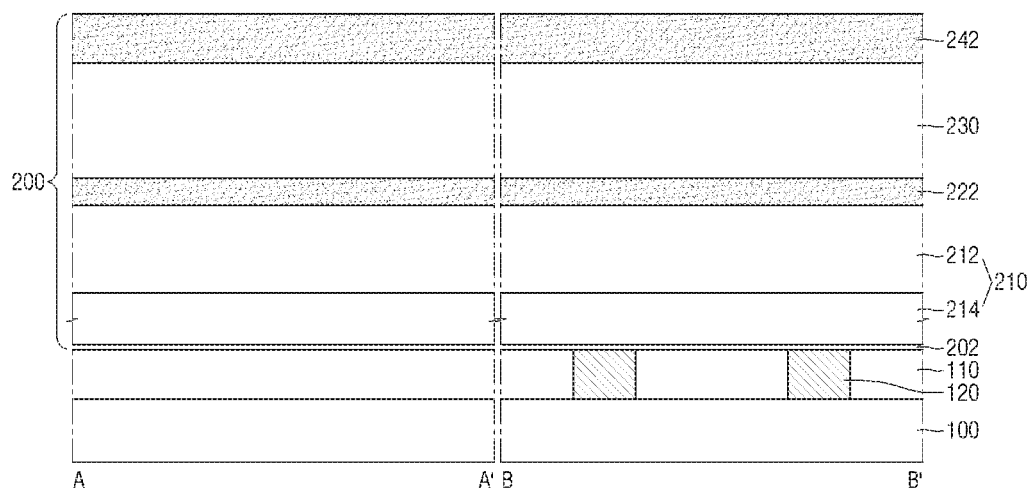
FIG. 4 to FIG. 12 are intermediate views illustrating a method of manufacturing a semiconductor device according to an exemplary embodiment.

The formation of the supporter patterns so as to have a difference between the first width w1 and the second width w2 is due to the fact that the material of the second supporter film (242 of FIG. 4) is different from the material of the first supporter film (222 of FIG. 4).

Specifically, in the process of forming the supporter pattern, first, the open region of the second supporter film (242 of FIG. 4) may be formed in a relatively small size using a mask pattern (268 of FIG. 9), and then, in the process of etching the second mold film (230 of FIG. 4), a part of the open region of the second supporter film (242 of FIG. 4) may be additionally etched.

Subsequently, the open region of the first supporter film (222 of FIG. 4) may be formed in a relatively small size using the mask pattern (268 of FIG. 9), and then, in the process of etching the first mold film (210 of FIG. 4), a part of the open region of the first supporter film (222 of FIG. 4) may be additionally etched.

Thus, the first width w1 of the first region R1 of the first supporter pattern 220 is formed to be smaller than the second width w2 of the third region R3 of the second supporter pattern 240. Details thereof will be described later.

The first distance between the respective structures S1, S2, and S3 exposed to the first region R1 of the first supporter pattern 220 may be different from the second distance d2 between the respective structures S1, S2, and S3 exposed to the third region R3 of the second supporter pattern 240. In this case, for example, as shown in FIG. 1 and FIG. 2, the first distance d1 may be greater than the second distance d2.

However, exemplary embodiments are not limited thereto. That is, in some other exemplary embodiments, the first distance d1 may be smaller than the second distance d2. Further, in some other exemplary embodiments, the first distance d1 may be substantially equal to the second distance d2.

The first length L1 of each of the of the first supporter pattern 220 disposed between the respective patterns S1, S2, and S3 may be different from the second length L2 of each of the sidewalls of the second supporter pattern 240 disposed between the respective patterns S1, S2, and S3. In this case, for example, as shown in FIG. 1 and FIG. 2, the second length L2 may be larger than the first length L1. However, exemplary embodiments are not limited thereto.

Referring to FIG. 3, the substrate 100 may be a laminate of a base plate and an epitaxial layer, but exemplary embodiments are not limited thereto. That is, in some other exemplary embodiments, the substrate 100 may be any one from among a silicon substrate, a gallium arsenide substrate, a silicon germanium substrate, a ceramic substrate, a quartz substrate, a glass substrate for display, and an semiconductor on insulator (SOI) substrate. Hereinafter, a silicon substrate will be described as an example. The substrate 100 may be a first conductor type (e.g., P-type) substrate, but exemplary embodiments are not limited thereto.

Although not shown in the drawing, a gate electrode, which is used as a bit line or a word line, may be disposed between the substrate 100 and the lower electrode 260.

Specifically, the substrate 100 may be provided with a unit active region and an element isolation region. In this case, one unit active region may include two transistors formed therein.

The two transistors may include two gate electrodes formed to cross the unit active region, a first source/drain region formed in the unit active region between the two gate electrodes, and a second source/drain region formed between each of the gate electrodes and the element isolation region. That is, the two transistors share a first source/drain region, and do not share a second source/drain region.

A gate insulation film may be formed along the sidewall and bottom surface of a trench formed in the substrate 100. The gate insulation film may contain, for example, silicon oxide or a high dielectric material having a dielectric constant higher than that of silicon oxide.

The gate electrodes may be formed to fill a part of the trench without completely filling the trench. That is, each of the gate electrodes may have a recessed form.

The gate electrode may be formed using any one from among doped polysilicon, titanium nitride (TiN), tantalum nitride (TaN), tungsten nitride (WN), titanium (Ti), tantalum (Ta), and tungsten. However, exemplary embodiments are not limited thereto.

A capping pattern may be formed on the gate electrode to fill the trench. The capping pattern may contain an insulating material, and, for example, may include at least one from among silicon oxide, silicon nitride, and silicon oxynitride.

An interlayer insulating film 110 may be formed on the substrate 100. The interlayer insulating film 110 may contain at least one from among silicon oxide, silicon nitride, and silicon oxynitride. The interlayer insulating film 110 may be a single layer or a multilayer.

The interlayer insulating film 110 may be provided therein with a first contact plug electrically connected with the first source/drain region. The first contact plug may contain a conductive material, and, may contain at least one from among polycrystalline silicon, metal silicide compounds, conductive metal nitrides, and metals. However, exemplary embodiments are not limited thereto.

A bit line electrically connected with the first contact plug may be formed on the first contact plug. The bit line may contain a conductive material, and, for example, may contain at least one from among polycrystalline silicon, metal silicide compounds, conductive metal nitrides, and metals. However, exemplary embodiments are not limited thereto.

The interlayer insulating film 110 may be provided therein with a second contact plug 120 penetrating the interlayer insulating film 110. The second contact plug 120 may be electrically connected with the second source/drain region. The second contact plug 120 may include a storage node contact.

The second contact plug 120 may contain a conductive material, and, for example, may contain at least one from among polycrystalline silicon, metal silicide compounds, conductive metal nitrides, and metals. However, exemplary embodiments are not limited thereto.

The lower electrode 260 may be formed on the substrate 100. Specifically, the lower electrode 260 may be formed on the interlayer insulating film 110 covering the gate electrode and the bit line. The lower electrode 260 may be electrically connected to the second contact plug 120. The lower electrode 260 may be formed to extend in a direction perpendicular to a plane disposed on the substrate 100. That is, the lower electrode 260 may extend in the thickness direction of the substrate 100.

In the semiconductor device according to some exemplary embodiments, the lower electrode 260 may have a cylindrical shape. The sidewall of the lower electrode 260 having a cylindrical shape may also have a shape such as a step, but exemplary embodiments are not limited thereto.

The lower electrode 260 may contain at least one selected from doped polysilicon, conductive metal nitrides (e.g., titanium nitride, tantalum nitride, and tungsten nitride), metals (e.g., ruthenium, iridium, titanium, and tantalum), and conductive metal oxides (e.g., iridium, etc.).

The first supporter pattern 220 and the second supporter pattern 240 may be disposed between the adjacent lower electrodes 260. However, the first supporter pattern 220 and the second supporter pattern 240, as shown in FIG. 1 to FIG. 3, are not disposed between the first to third structures S1, S2, and S3.

The first supporter pattern 220 and the second supporter pattern 240 may be formed on the outer wall of the lower electrode 260 to connect the outer wall of another lower electrode 260 adjacent to the lower electrode 260. The first supporter pattern 220 and the second supporter pattern 240 may be in contact with the lower electrode 260.

The first supporter pattern 220 and the second supporter pattern 240 may be disposed to be spaced apart from each other. Specifically the first supporter pattern 220 and the second supporter pattern 240 may be disposed to be spaced apart from each other in a direction in which the lower electrode 260 extends. For example, the first supporter pattern 220 may be disposed closer to the upper surface of the substrate 100, compared to the second supporter pattern 240.

The height of the lower electrode 260 from the substrate 100 may be equal to the height of the second supporter pattern 240 from the substrate 100. That is, the upper surface of the second supporter pattern 240 may be formed on the uppermost portion of the lower electrode 260.

The capacitor dielectric film 270 may be conformally formed on the lower electrode 260, the first supporter pattern 220, and the second supporter pattern 240. The capacitor dielectric film 270 may be formed entirely on the outer and inner walls of the lower electrode 260. The capacitor dielectric film 270 may be a single layer or a multilayer.

The capacitor dielectric film 270 may contain at least one from among silicon oxide, silicon nitride, silicon oxynitride, and a high dielectric material. Examples of the high dielectric material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, Aluminum oxide, lead scandium tantalum oxide, and lead zinc niobate. However, exemplary embodiments are not limited thereto.

Hereinafter, a method of manufacturing a semiconductor device according to an exemplary embodiment will be described with reference to FIG. 4 to FIG. 12.

FIG. 4 to FIG. 12 are intermediate views for illustrating a method of manufacturing a semiconductor device according to an exemplary embodiment.

Referring to FIG. 4, an insulation layer 200 is formed on a substrate 100. The insulation layer 200 may include an etching resistant film 202, a first mold film 210, a first supporter film 222, a second mold film 230, and a second supporter film 242, which are sequentially laminated.

The etching resistant film 202 may contain a material having an etching selection ratio to the first mold film 210 and the second mold film 230, which contain oxide. The etching resistant film 202 may formed using chemical vapor deposition. The etching resistant film 202 may contain, for example, silicon nitride, but exemplary embodiments are not limited thereto.

The first mold film 210 may be formed on the etching resistant film 202. The first mold film 210 may contain silicon oxide, and, for example, may contain Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PE-TEOS), Fluoride Silicate Glass (FSG), High Density Plasma (HDP), Plasma Enhanced Oxide (PEOX), Flowable CVD (FCVD), or a combination thereof.

The first mold film 210 may include a first upper mold film 212 and a first lower mold film 214 having different etching rates. For example, the first lower mold film 214 may contain an oxide doped with an impurity, and the first upper mold film 212 may contain an oxide not doped with an impurity.

Figure 5:
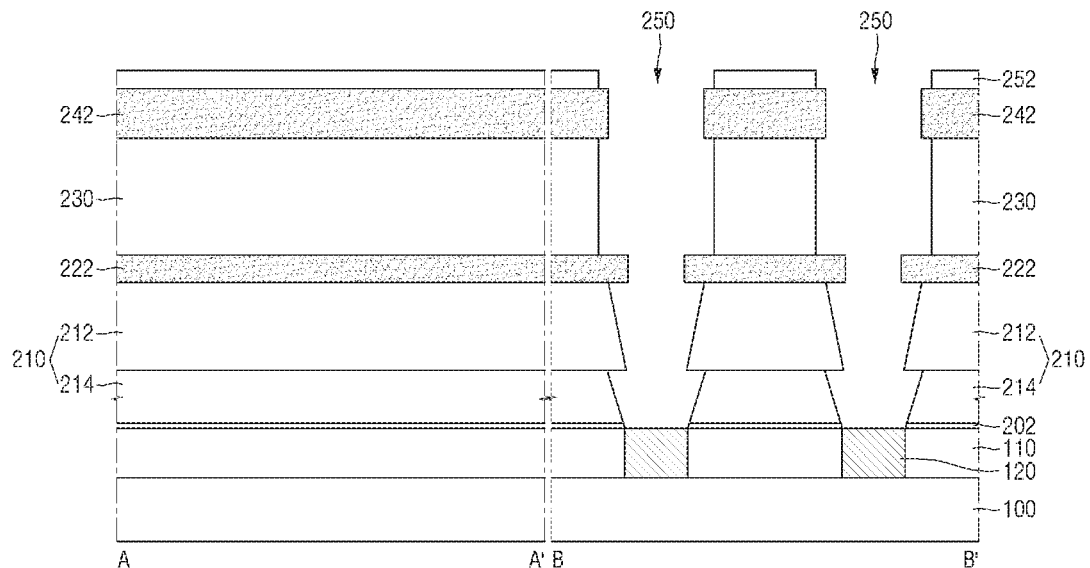

The first lower mold film 214 may contain BPSG or PSG, and the first upper mold film 212 may contain PE-TEOS or HDP-CVD oxide. In the subsequent etching process, the first lower mold film 214 may be etched faster than the first upper mold film 212. Due to the etching rate difference between the first lower mold film 214 and the first upper mold film 212, a step-like shape or a pyramid shape may appear on the sidewall of a contact hole 250 (FIG. 5).

The first supporter film 222 containing SiCN may be formed on the first mold film 210. Through the subsequent process, the first supporter film 222 may form the first supporter pattern 220 (FIG. 3). The position of the first supporter film 222 may be adjusted as necessary in correspondence with the shape of the contact hole 250 (FIG. 5) to be formed later and the change in the etching time taken to form the contact hole 250 (FIG. 5).

The second mold film 230 may be formed on the first supporter film 222. The second mold film 230 may contain an oxide. The second mold film 230 may contain, for example, PE-TEOS or HDP-CVD oxide.

The second mold film 230 may be formed using an oxide having a different impurity concentration from the first mold film 210. Thus, the first mold film 210 and the second mold film 230 may be etched at different etching rates, respectively.

The second supporter film 242 containing SiCN may be formed on the second mold film 230. Through the subsequent process, the second supporter film 242 may form the second supporter pattern 240 (FIG. 3).

Subsequently, referring to FIG. 5, a node mask 252 may be formed on the second supporter film 242. Specifically, a mask layer (not shown) containing a material having an etching selection ratio to the second supporter film 242 may be formed on the insulation layer 200. The node mask 252 defining a region in which the contact hole for the lower electrode 260 (FIG. 7) will be formed may be formed on the second supporter film 242 by etching the mask layer.

Subsequently, the contact hole 250 may be formed in the insulation layer 200. The contact hole 250 may be formed by etching the insulation layer 200 using the node mask 252 as a mask. That is, the contact hole 250 may be formed in the insulation layer 200 by etching the second supporter film 242, the second mold film 230, the first supporter film 222, the first mold film 210, and the etching resistant film 202. The second contact plug 120 may be exposed by the contact hole 250.

The etching process of forming the contact hole 250, for example, may include at least one from among wet etching and dry etching. Specifically, the second supporter film 242 containing SiN may be etched using an etching gas for etching nitride. Subsequently, the second mold film 230, the first supporter film 222, the first mold film 210, and the etching resistant film 202 may be etched by performing respective etching processes according to the respective layers. In this manner, when the contact hole 250 is formed through various etching processes, the uniformity of the etching process for forming the contact hole 250 can be improved.

After the etching process for forming the contact hole 250, a cleaning process may be performed. Through the cleaning process, by-products, such as natural oxide films and polymers, can be removed from the substrate 100 provided with the contact hole 250.

When the cleaning process is performed using a cleaning solution including deionized water and an aqueous ammonia solution or sulfuric acid, the first mold film 210 and the second mold film 230 may be partially etched, and thus the diameter of the contact hole 250 may be increased. In contrast, the first supporter film 222 and the second supporter film 242 each containing a material having an etching selection ratio to the first mold film 210 and the second mold film 230 may not be etched during the cleaning process.

Thus, the first supporter film 222 and the second supporter film 242 may partially extend along the horizontal direction of the substrate 100, and thus protrude into the contact hole 250.

Figure 6:
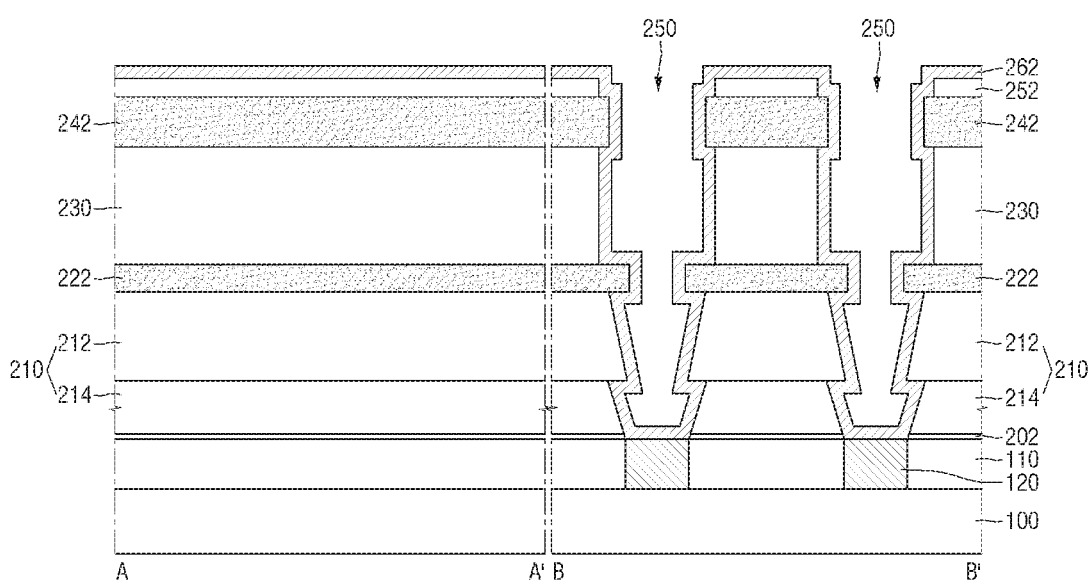

Subsequently, referring to FIG. 6, a lower electrode film 262 may be formed on the upper surface of the exposed second contact plug 120, the inner wall of the contact hole 250, the first supporter film 222 and second supporter film 242, and the node mask 252.

The lower electrode film 262 may contain a conductive material, and, for example, may contain at least one selected from doped polysilicon, conductive metal nitrides (e.g., titanium nitride, tantalum nitride, and tungsten nitride), metals (e.g., ruthenium, iridium, titanium, and tantalum), and conductive metal oxides (e.g., iridium, etc.).

Because the first supporter film 222 and the second supporter film 242 horizontally protrude into the contact hole 250, the lower electrode film 262 may be formed to surround the protrusions of the first supporter film 222 and the second supporter film 242.

Figure 7:
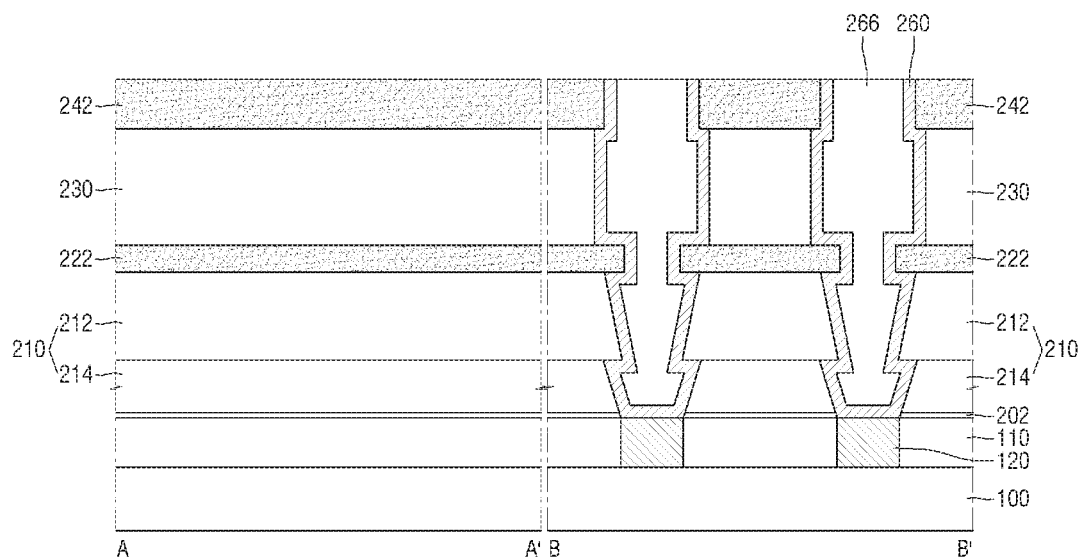

Subsequently, referring to FIG. 7, a sacrificial film 266 may be formed on the lower electrode film 262 to fill the contact hole 250. The sacrificial film 266 may contain a material having a good gap-filling capability, and, for example, may contain an oxide, such as USG or Spin On Glass (SOG). The sacrificial film 266 may function to protect the lower electrode 260 during the polishing process and etching process for completing the lower electrode 260 thereafter.

Subsequently, the node mask 252 on the second supporter film 242, a part of the lower electrode film 262, and a part of the sacrificial film 266 may be removed using a process including at least one from among chemical mechanical polishing and etching back until the second supporter film 242 is exposed.

In this way, lower electrodes 260 electrically connected with the second contact plug 120 may be formed in the contact hole 250. The lower electrodes 260 may be electrically separated from each other. The sacrificial film 266 may fill the contact hole 250 in which the lower electrode 260 is formed.

Figure 8:
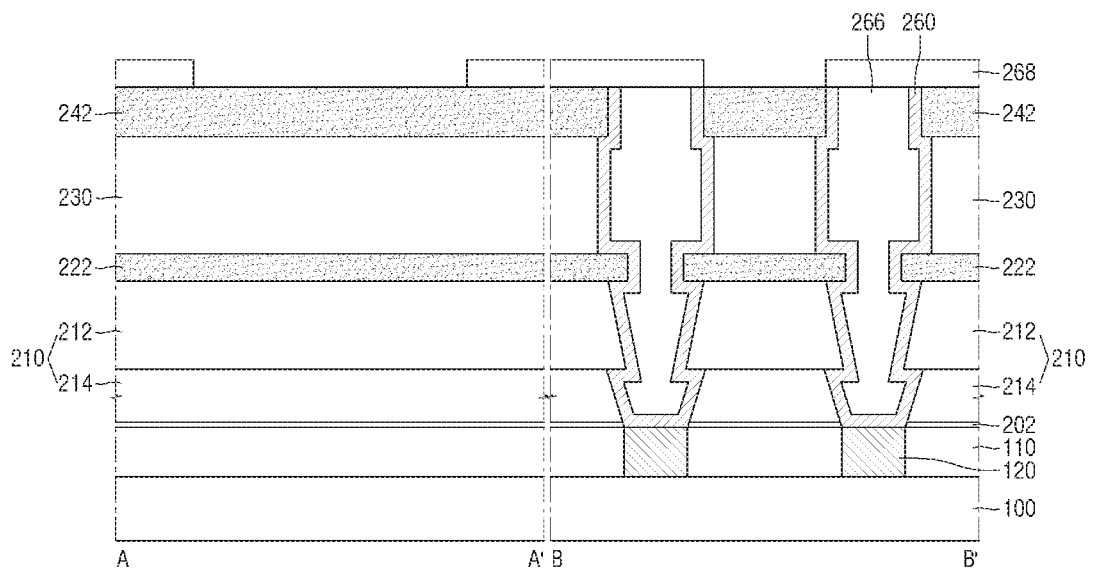

Subsequently, referring to FIG. 8, a mask pattern 268 may be formed on a part of the second supporter film 242, the lower electrode 260, and the sacrificial film 266.

Specifically, the mask pattern 268 may be formed on the second supporter film 242, the lower electrode 260, and the sacrificial film 266, excluding the region between the adjacent lower electrodes 260, that is, a region overlapping the region corresponding to the first region R1 of the first supporter pattern 220 shown in FIG. 1.

Subsequently, referring to FIG. 9, the second supporter film 242 may be etched using the mask pattern 268 as a mask. The second supporter film 242 may be removed by an etching process, for example, a dry etching process.

Figure 9:
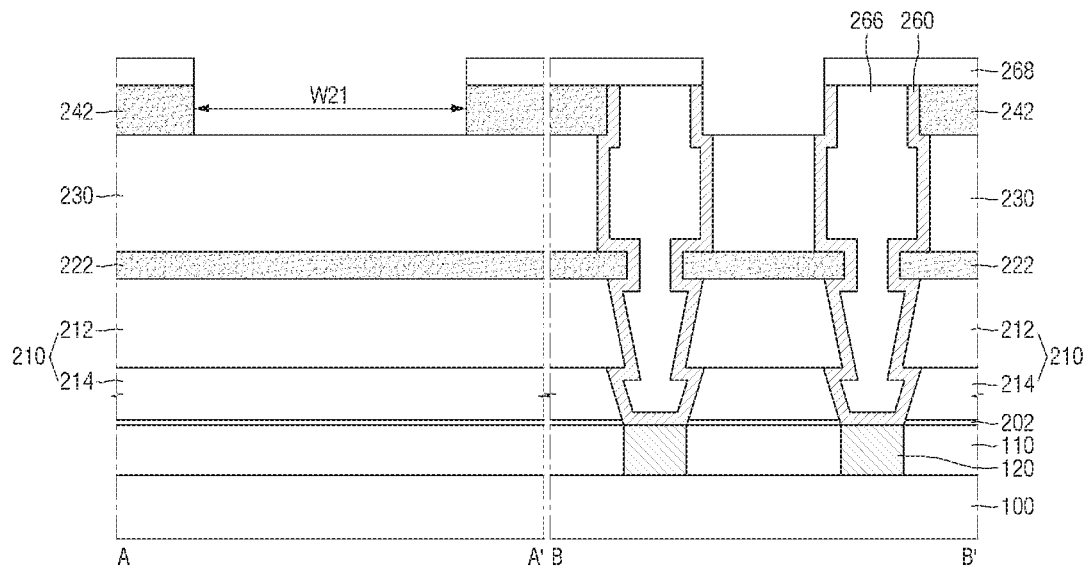

In this case, as shown in the region taken along the line A-A' in FIG. 9, the width w21 between the non-etched second supporter films 242 may be defined by the mask pattern 268.

Subsequently, referring to FIG. 10, the second mold film 230 may be removed by performing an etching process, for example, a wet etching process, through the trench formed by etching the second supporter film 242.

Figure 10:
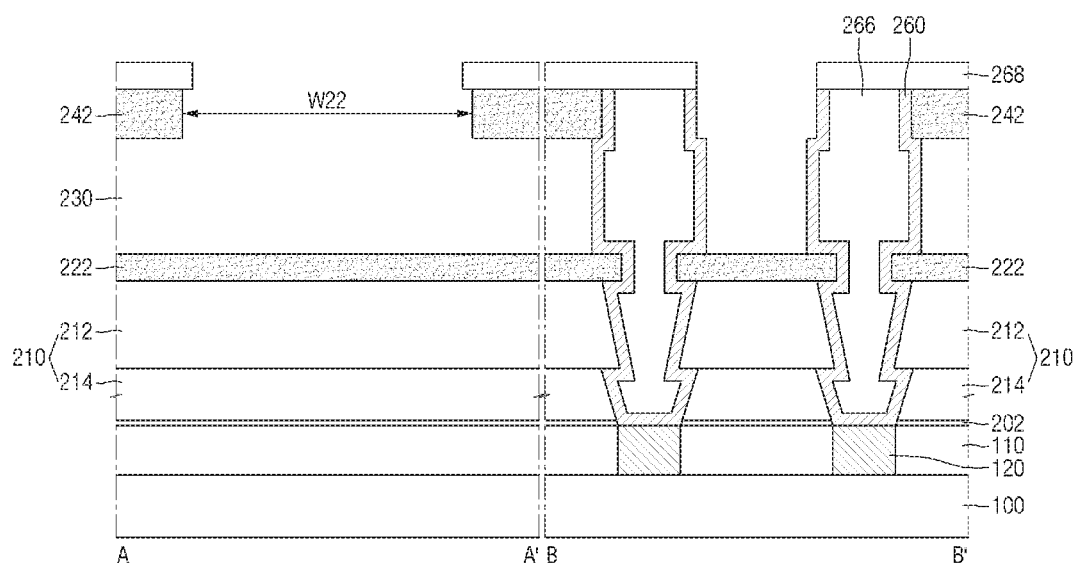

In this case, as shown in the region taken along the line A-A' in FIG. 10, a part of the second supporter film 242 may also be etched. Thus, the width w22 between the non-etched second supporter films 242 may be increased compared to the width w21 (shown in FIG. 9) between the non-etched second supporter films 242.

Figure 11:
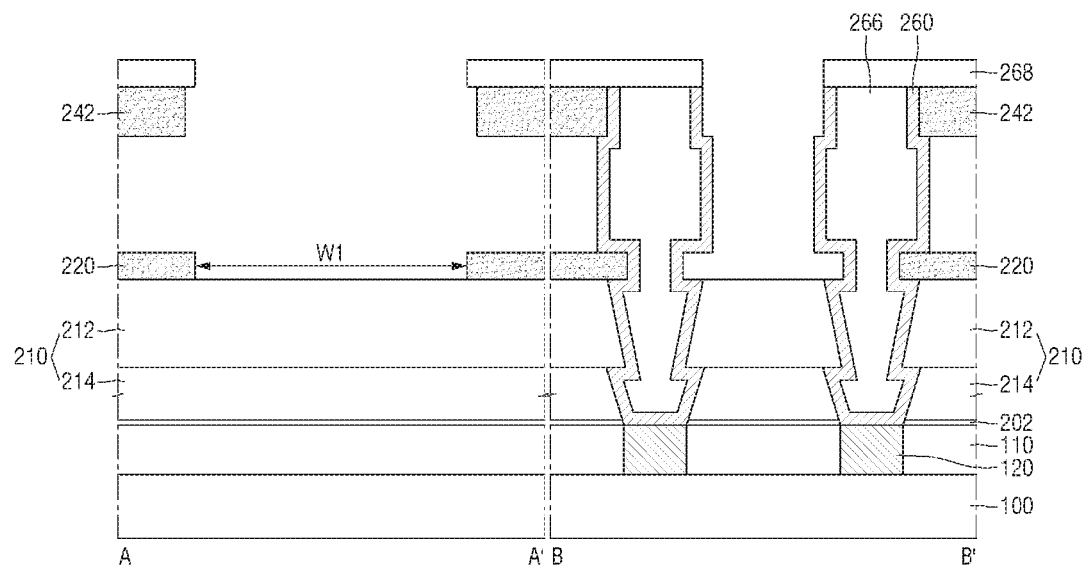

Subsequently, referring to FIG. 11, the first supporter pattern 220 may be formed by etching the first supporter film 222 using the mask pattern 268 as a mask. The first supporter film 222 may be removed by an etching process, for example, a dry etching process.

In this case, the width w1 of the open region of the first supporter pattern 220, that is, the first region (R1 of FIG. 1), may be defined by the mask pattern 268.

Subsequently, referring to FIG. 12, the first mold film 210 may be removed by performing an etching process, for example, a wet etching process through the trench formed by etching the first supporter film 222.

Figure 12:
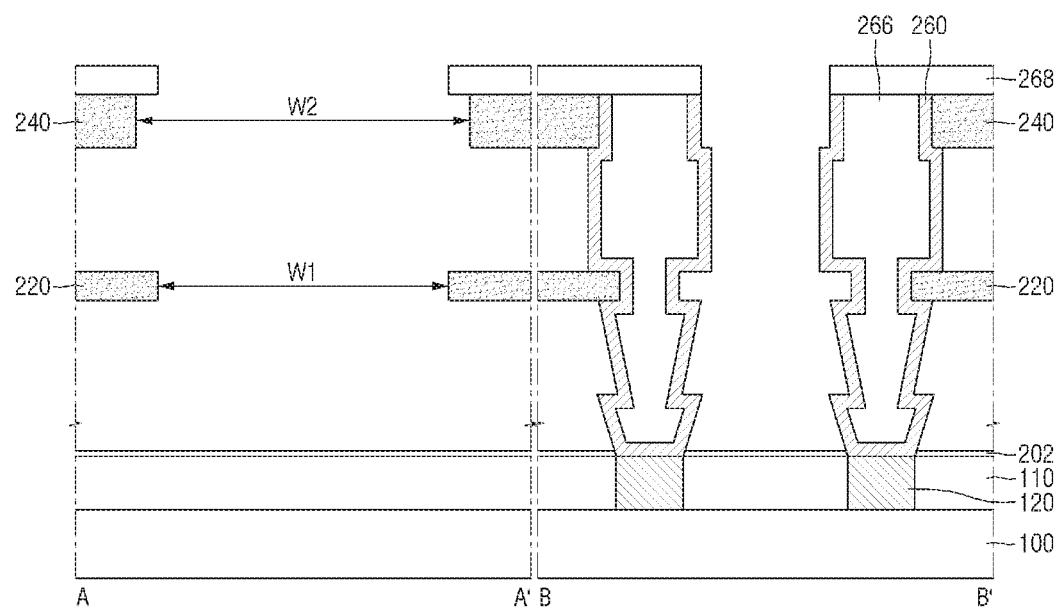

In this case, as shown in the region taken along the line A-A' in FIG. 12, a part of the second supporter film 242 may also be etched to form the second supporter pattern 240. Thus, the width w2 of the open region of the second supporter pattern 240, that is, the third region (R3 of FIG. 2), may be greater than the width w1 of the first region (R1 of FIG. 1) of the first supporter pattern 220.

Although it is illustrated that a part of the first supporter film 222 and a part of the second supporter film 242 are removed through a dry etching process, exemplary embodiments are not limited thereto. Further, although it is illustrated that the first mold film 210 and the second mold film 230 are removed by a wet etching process, exemplary embodiments are not limited thereto.

Subsequently, referring to FIG. 3 again, after the mask pattern 268 and the sacrificial film 266 are removed, a capacitor dielectric film 270 may be conformally formed on the outer wall of the lower electrode 260, the inner wall of the lower electrode 260, the first supporter pattern 220, the second supporter pattern 240, and the etching resistant film 202.

Subsequently, an upper electrode 280 may be formed on the capacitor dielectric film 270. Specifically, the upper electrodes 280 may be formed between the lower electrodes 260 in each structure having a cylindrical shape, between the adjacent different lower electrodes 260, between the first supporter pattern 220 and the second supporter pattern 240, and between the first supporter pattern 220 and the etching resistant film 202. Through such processes, the semiconductor device 1 shown in FIG. 3 may be formed.

The upper electrode 280 may contain at least one from among doped polysilicon, metals, conductive metal nitrides, and metal silicides.

Hereinafter, a semiconductor device according to another exemplary embodiment will be described with reference to FIG. 13. Differences from the semiconductor device shown in FIG. 3 will be mainly described.

Figure 13:
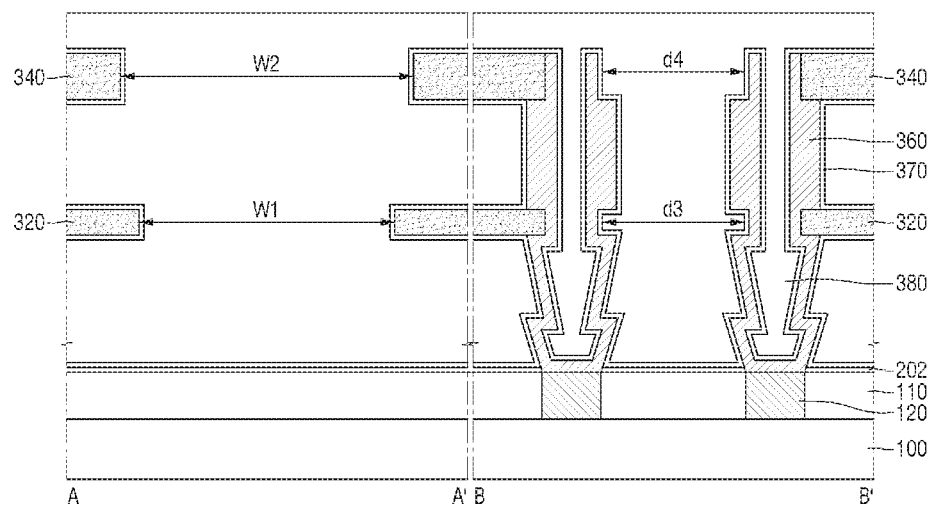
FIG. 13 is a sectional view of a semiconductor device according to another exemplary embodiment.

FIG. 13 is a sectional view of a semiconductor device according to another exemplary embodiment.

Referring to FIG. 13, the semiconductor device 2 according to another exemplary embodiment includes a substrate 100, an interlayer insulating film 110, a contact plug 120, an etching resistant film 202, a first supporter pattern 320, a second supporter pattern 340, a lower electrode 360, a capacitor dielectric film 370, and an upper electrode 380.

The semiconductor device 2, unlike the semiconductor device shown in FIG. 3, is configured such that the first distance d3 between the respective structures S1, S2, and S3 exposed to the first region R1 of the first supporter pattern 320 is substantially equal to the second distance d4 between the respective structures S1, S2, and S3 exposed to the third region R3 of the second supporter pattern 340.

Hereinafter, a semiconductor device according to still another exemplary embodiment will be described with reference to FIG. 14. Differences from the semiconductor device shown in FIG. 3 will be mainly described.

Figure 14:
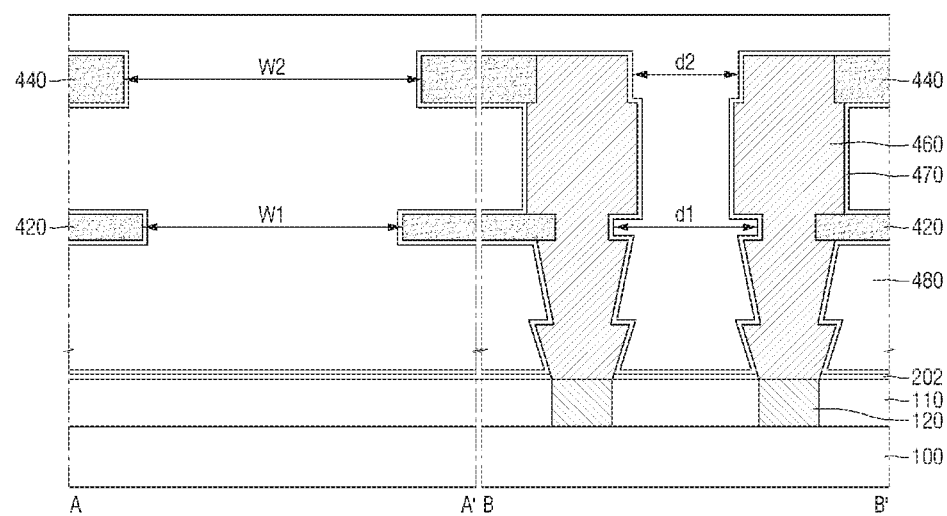
FIG. 14 is a sectional view of a semiconductor device according to still another exemplary embodiment.

FIG. 14 is a sectional view of a semiconductor device according to still another exemplary embodiment.

Referring to FIG. 14, the semiconductor device 3 according to another exemplary embodiment includes a substrate 100, an interlayer insulating film 110, a contact plug 120, an etching resistant film 202, a first supporter pattern 420, a second supporter pattern 440, a lower electrode 460, a capacitor dielectric film 470, and an upper electrode 480.

The semiconductor device 3, unlike the semiconductor device shown in FIG. 3, is configured such that each of the structures is a pillar-shaped (pillar shape) structure which is completely filled with the lower electrode 460. That is, the upper electrode is not formed in each of the structures.

The outer wall of the lower electrode 460 may have a protrusion. The protrusion formed on the outer wall of the lower electrode 460 may have, for example, a step shape, but exemplary embodiments are not limited thereto.

Hereinafter, a semiconductor device according to still another exemplary embodiment will be described with reference to FIG. 15 and FIG. 16. Differences from the semiconductor device shown in FIG. 1 and FIG. 2 will be mainly described.

Figure 15:
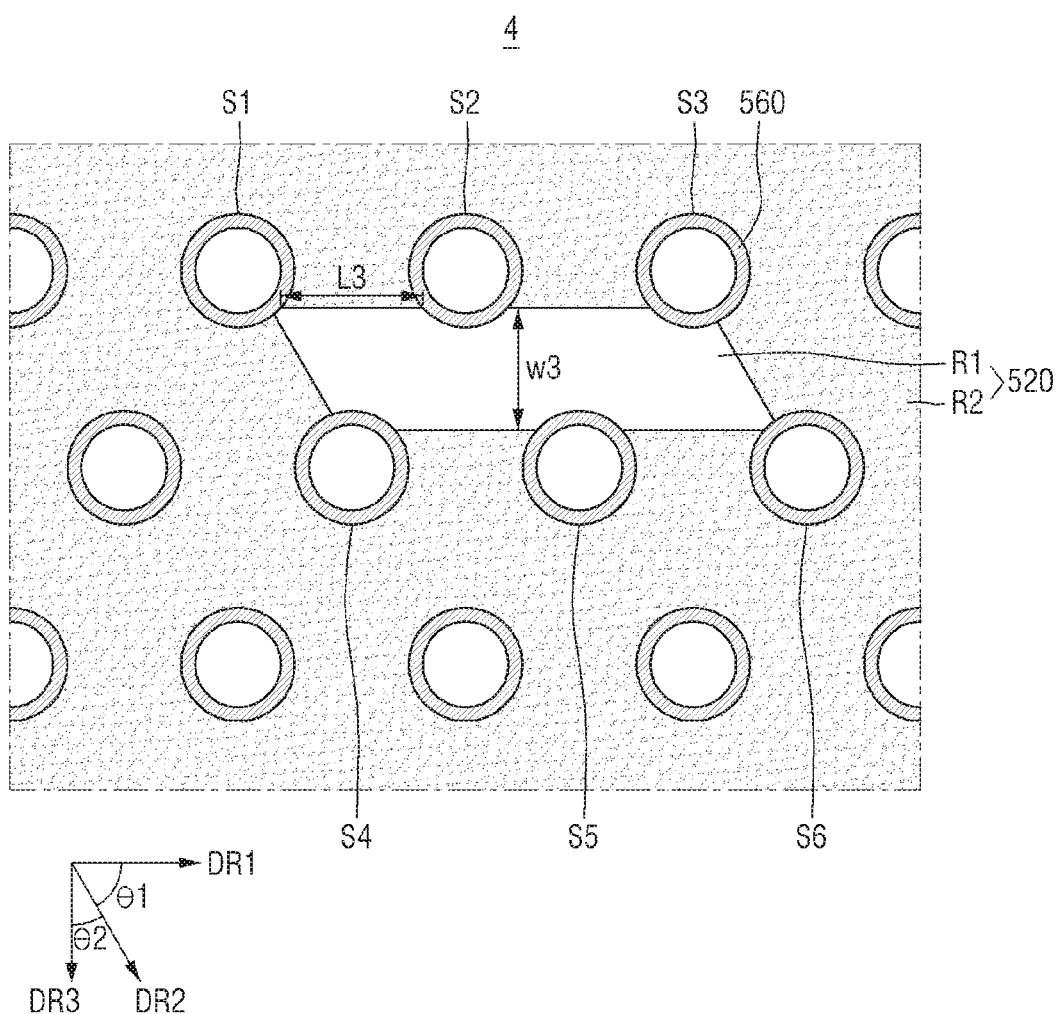
FIG. 15 is a view illustrating the mid supporter pattern of a semiconductor device according to still another exemplary embodiment.

FIG. 15 is a view for illustrating the mid supporter pattern of a semiconductor device according to still another exemplary embodiment. FIG. 16 is a view for illustrating the top supporter pattern of a semiconductor device according to still another exemplary embodiment.

Referring to FIG. 15, the semiconductor device 4, unlike the semiconductor device 1 shown in FIG. 1, is configured such that the mid supporter pattern thereof, that is, the first region R1, which is an open region of the first supporter pattern 520 has a parallelogram shape.

Specifically, the first region R1 of the first supporter pattern 520 may expose parts of the sidewalls of a first structure S1, a second structure S2, a third structure S3 spaced from the second structure S2 in a first direction DR1, a fourth structure S4 spaced from the first structure S1 in a second direction DR2 having an acute angle to the first direction DR1, a fifth structure S5 spaced from the second structure S2 in the second direction DR2, and a sixth structure S6 spaced from the third structure S3 in the second direction DR2. Further, the first region R1 of the first supporter pattern 520 may cover other parts of the sidewalls of the first to sixth structures S1 to S6. In this case, each of the first to sixth structures S1 to S6 may include a lower electrode 560.

Figure 16:
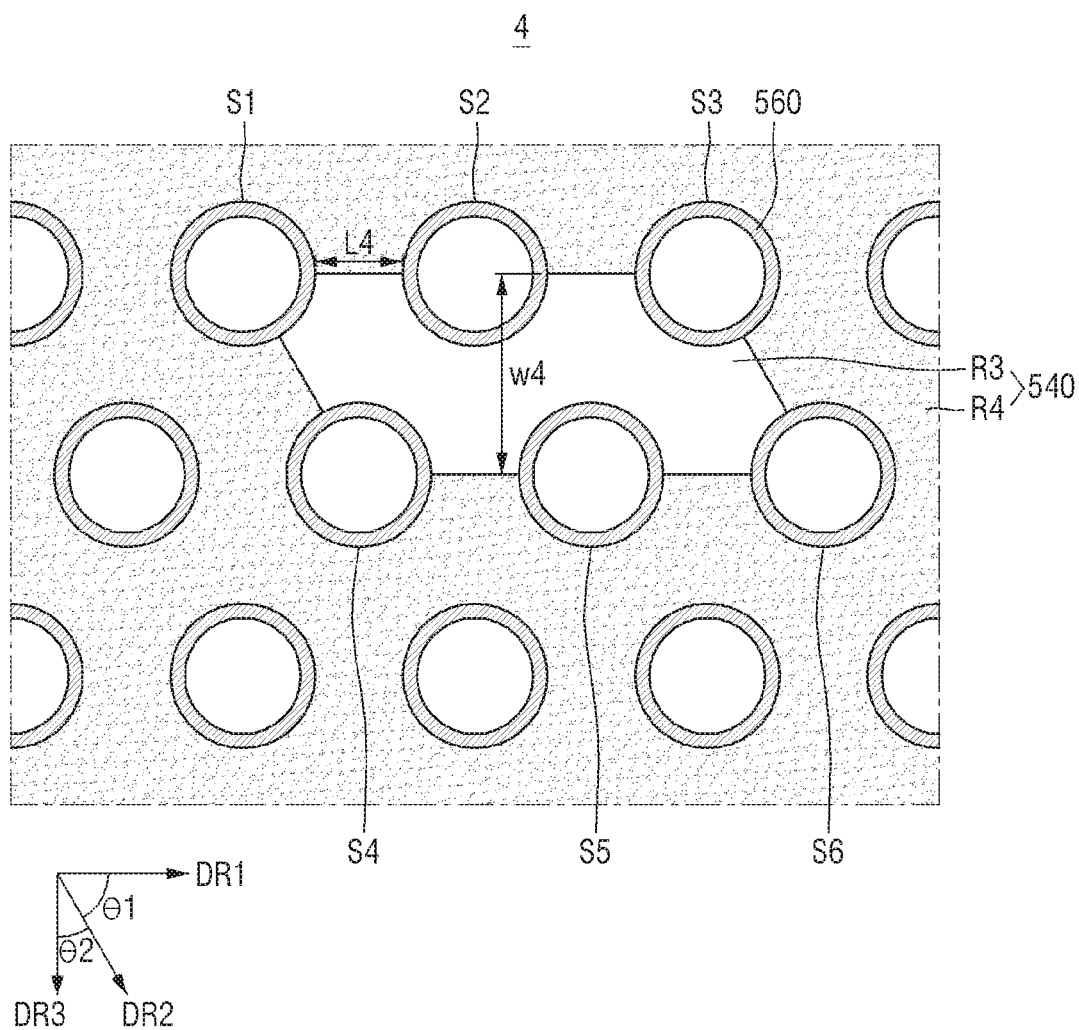
FIG. 16 is a view illustrating the top supporter pattern of a semiconductor device according to still another exemplary embodiment.

Referring to FIG. 16, the semiconductor device 4, unlike the semiconductor device 1 shown in FIG. 2, is configured such that the top supporter pattern thereof, that is, the third region R3, which is an open region of the second supporter pattern 540 has a parallelogram shape.

Specifically, the third region R3 of the second supporter pattern 540 may expose parts of the sidewalls of the first to sixth structures S1 to S6. Further, the fourth region R4 of the second supporter pattern 540 may cover other parts of the sidewalls of the first to sixth structures S1 to S6.

The third width w3 of the first region R1 of the first supporter pattern 520 in the third direction DR3 perpendicular to the first direction DR1 is smaller than the fourth width w4 of the third region R3 of the second supporter pattern 540 in the third direction DR3.

Further, the third length L3 of the sidewall of each of the first supporter patterns 520 disposed between the respective structures S1 to S6 may be different from the fourth length L4 of the sidewall of each of the second supporter patterns 540 disposed between the respective structures S1 to S6. In this case, for example, as shown in FIG. 15 and FIG. 16, the third length L3 may be greater than the fourth length L4. However, exemplary embodiments are not limited thereto.

Hereinafter, a semiconductor device according to still another exemplary embodiment will be described with reference to FIG. 17 and FIG. 18. Differences from the semiconductor device shown in FIG. 1 and FIG. 2 will be mainly described.

Figure 17:
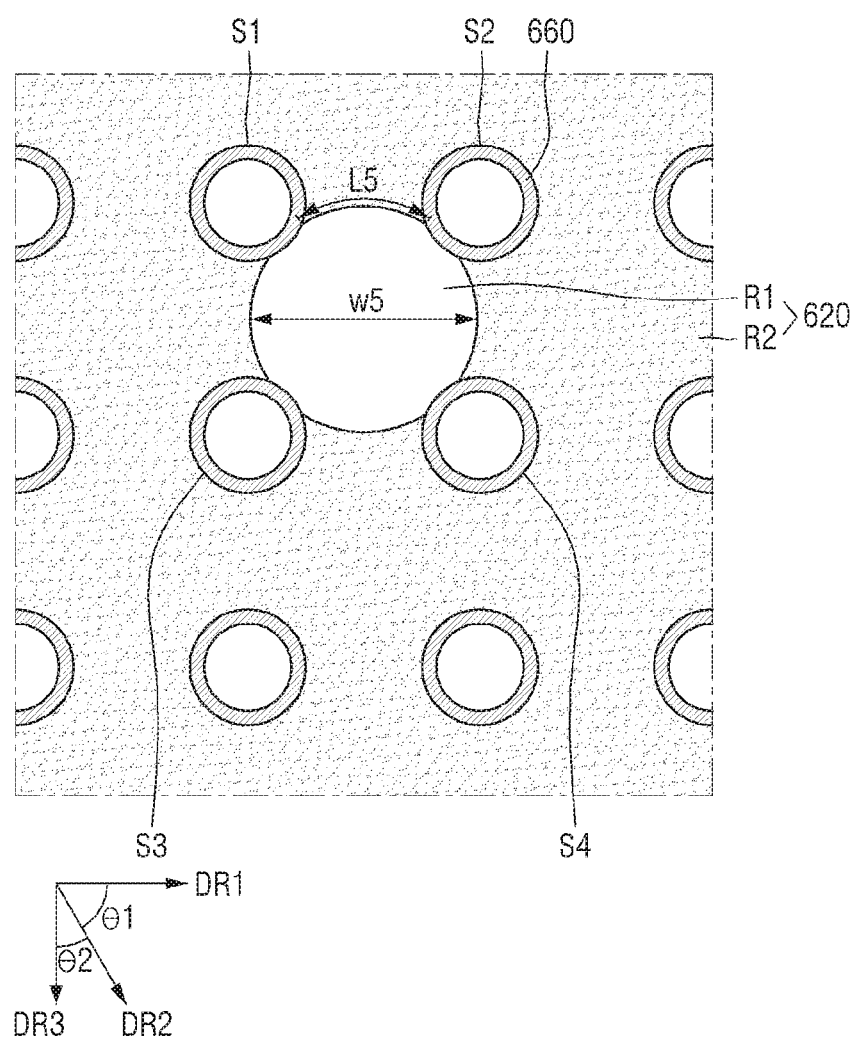
FIG. 17 is a view illustrating the mid supporter pattern of a semiconductor device according to still another exemplary embodiment.

FIG. 17 is a view for illustrating the mid supporter pattern of a semiconductor device according to still another exemplary embodiment. FIG. 18 is a view for illustrating the top supporter pattern of a semiconductor device according to still another exemplary embodiment.

Referring to FIG. 17, the semiconductor device 5, unlike the semiconductor device 1 shown in FIG. 1, is configured such that the third structure S3 is disposed to be spaced from the first structure S1 in the third direction DR3 perpendicular to the second direction DR2. Further, the fourth structure S4 is disposed to be spaced from the second structure S2 in the third direction DR3.

The mid supporter pattern, that is, the first region R1 of the first supporter pattern 620, may expose parts of the sidewalls of first to fourth structure S1 to S4. Further, the second region R2 of the first supporter pattern 620 may cover other parts of the sidewalls of the first to fourth structures S1 to S4. In this case, each of the first to fourth structures S1 to S4 may include a lower electrode 660.

Figure 18:
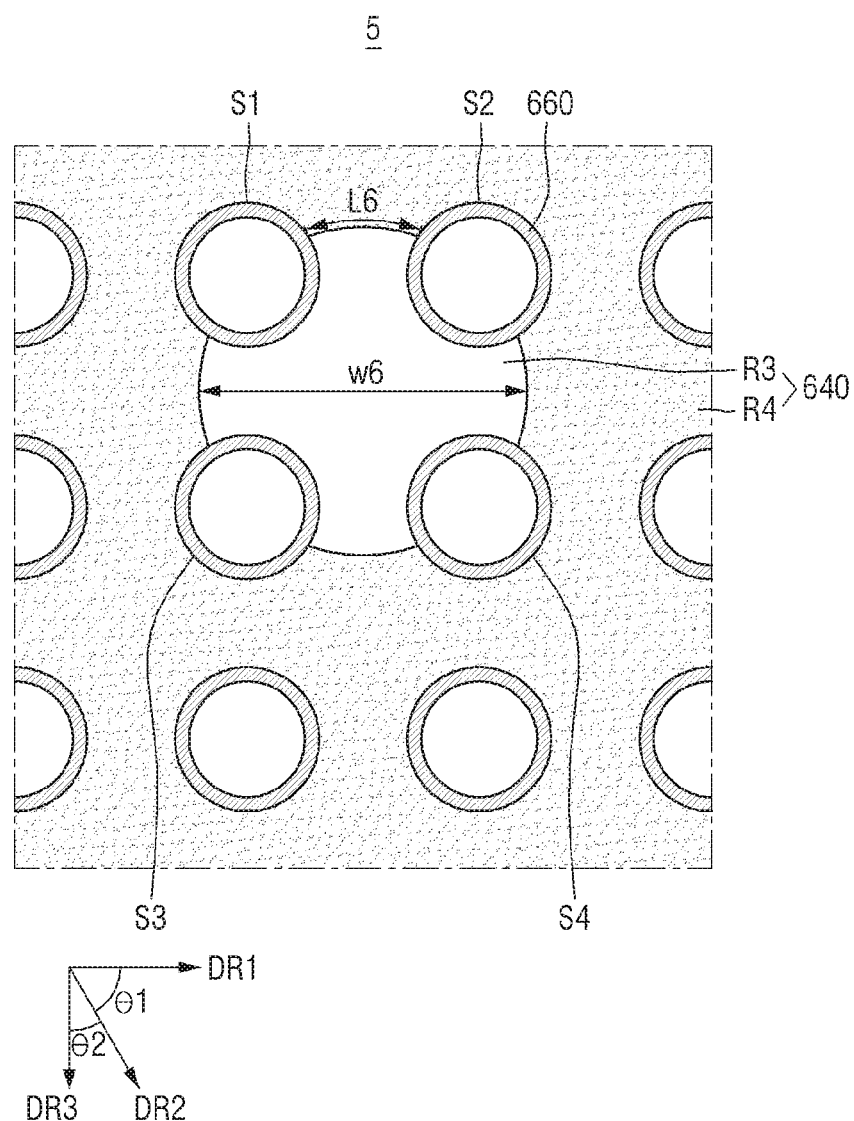
FIG. 18 is a view illustrating the top supporter pattern of a semiconductor device according to still another exemplary embodiment.

Referring to FIG. 18, the semiconductor device 5, unlike the semiconductor device 1 shown in FIG. 2, is configured such that the top supporter pattern, the third region R3 of the second supporter pattern 640 may expose parts of the sidewalls of first to fourth structure S1 to S4. Further, the fourth region R4 of the second supporter pattern 640 may cover other parts of the sidewalls of the first to fourth structures S1 to S4.

The fifth width w5 of the first region R1 of the first supporter pattern 620 is smaller than the sixth width w6 of the third region R3 of the second supporter pattern 640.

Further, the fifth length L5 of the sidewall of each of the first supporter patterns 620 disposed between the respective structures S1 to S4 may be different from the sixth length L6 of the sidewall of each of the second supporter patterns 640 disposed between the respective structures S1 to S4. In this case, for example, as shown in FIG. 17 and FIG. 18, the fifth length L5 may be greater than the sixth length L6. However, exemplary embodiments are not limited thereto.

Hereinafter, a semiconductor device according to still another exemplary embodiment will be described with reference to FIG. 19 and FIG. 20. Differences from the semiconductor device shown in FIG. 1 and FIG. 2 will be mainly described.

Figure 19:
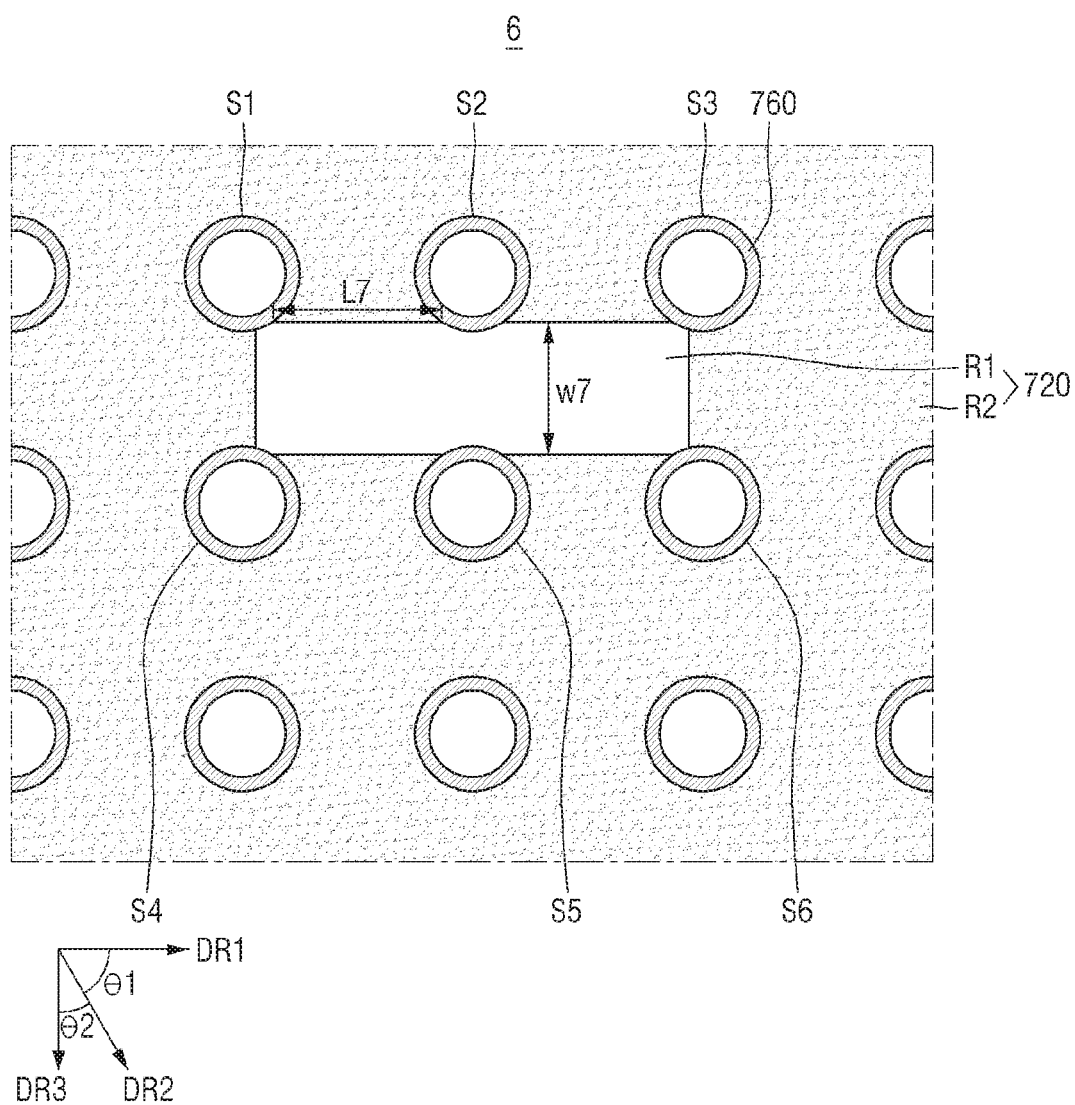
FIG. 19 is a view illustrating the mid supporter pattern of a semiconductor device according to still another exemplary embodiment.

FIG. 19 is a view for illustrating the mid supporter pattern of a semiconductor device according to still another exemplary embodiment. FIG. 20 is a view for illustrating the top supporter pattern of a semiconductor device according to still another exemplary embodiment.

Referring to FIG. 19, the semiconductor device 6, unlike the semiconductor device 1 shown in FIG. 1, is configured such that the mid supporter pattern thereof, that is, the first region R1, which is an open region of the first supporter pattern 720, has a rectangular shape.

Specifically, the first region R1 of the first supporter pattern 720 may expose parts of the sidewalls of a first structure S1, a second structure S2, a third structure S3 spaced from the second structure S2 in a first direction DR1, a fourth structure S4 spaced from the first structure S1 in a third direction DR3 perpendicular to the first direction DR1, a fifth structure S5 spaced from the second structure S2 in the third direction DR3, and a sixth structure S6 spaced from the third structure S3 in the third direction DR3. Further, the second region R2 of the first supporter pattern 720 may cover other parts of the sidewalls of the first to sixth structures S1 to S6. In this case, each of the first to sixth structures S1 to S6 may include a lower electrode 760.

Figure 20:
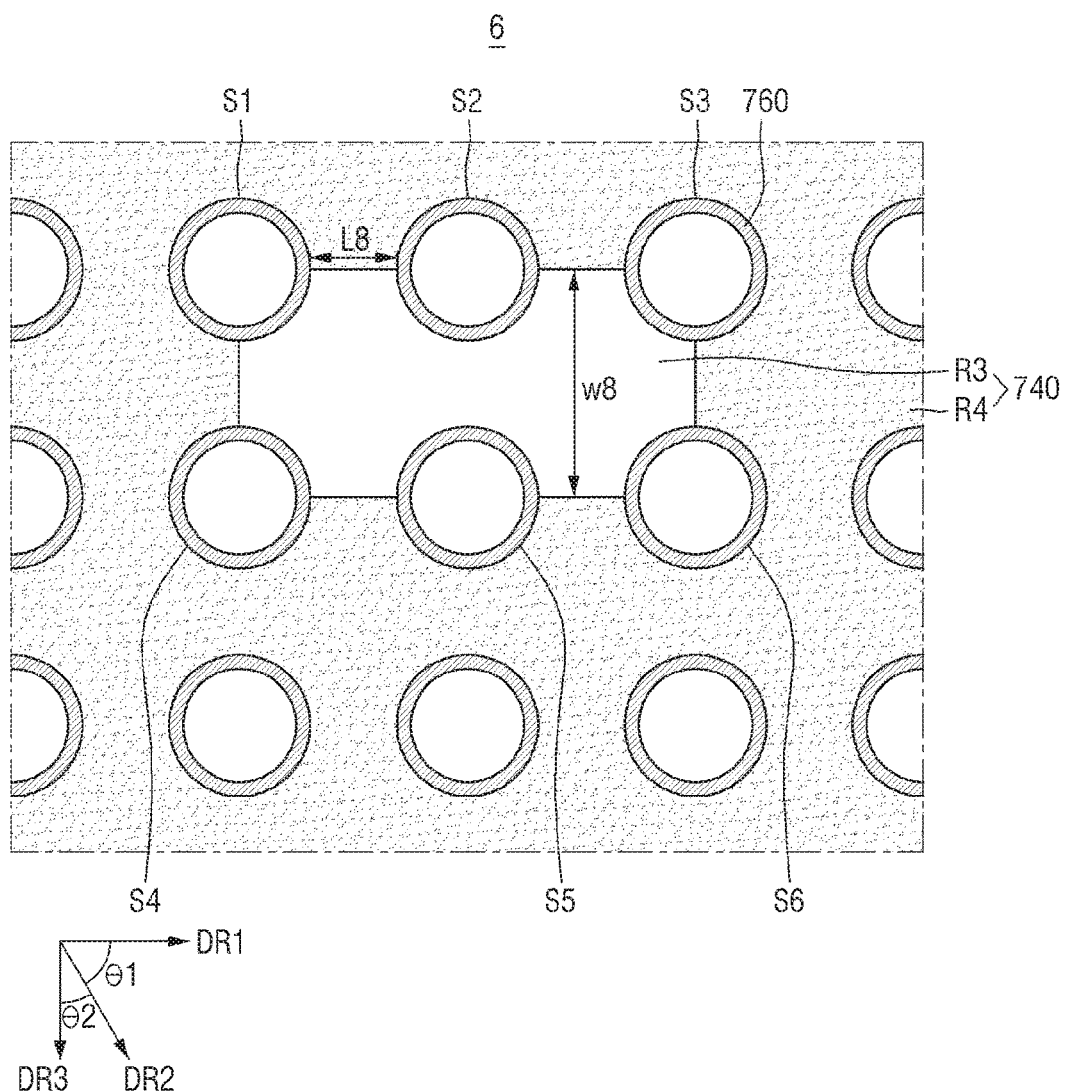
FIG. 20 is a view illustrating the top supporter pattern of a semiconductor device according to still another exemplary embodiment.

Referring to FIG. 20, the semiconductor device 6, unlike the semiconductor device 1 shown in FIG. 2, is configured such that the top supporter pattern thereof, that is, the third region R3, which is an open region of the second supporter pattern 740 has a rectangular shape.

Specifically, the third region R3 of the second supporter pattern 740 may expose parts of the sidewalls of the first to sixth structures S1 to S6. Further, the fourth region R4 of the second supporter pattern 740 may cover other parts of the sidewalls of the first to sixth structures S1 to S6.

The seventh width w7 of the first region R1 of the first supporter pattern 720 in the third direction DR3 is smaller than the eighth width w8 of the third region R3 of the second supporter pattern 740 in the third direction DR3.

Further, the seventh length L7 of the sidewall of each of the first supporter patterns 720 disposed between the respective structures S1 to S6 may be different from the eighth length L8 of the sidewall of each of the second supporter patterns 740 disposed between the respective structures S1 to S6. In this case, for example, as shown in FIG. 19 and FIG. 20, the seventh length L7 may be greater than the eighth length L8. However, exemplary embodiments are not limited thereto.

Although exemplary embodiments have been disclosed for illustrative purposes, those skilled in the art will appreciate that various modifications, additions and substitutions are possible, without departing from the scope and spirit of the accompanying claims.

What is claimed is:
1. A semiconductor device, comprising:
a substrate;
a first structure and a second structure spaced apart from each other on the substrate in a first direction, the first structure including a first lower electrode and the second structure including a second lower electrode;
a first supporter pattern disposed on the substrate to support the first structure and the second structure, the first supporter pattern defining a first opening that exposes a first portion of a first sidewall of the first structure and a second sidewall of the second structure and covering a second portion of the first sidewall and the second sidewall; and
a second supporter pattern disposed on the first supporter pattern to support the first structure and the second structure, the second supporter pattern defining a second opening that exposes a third portion of the first sidewall and the second sidewall and covering a fourth portion of the first sidewall and the second sidewall,
wherein a first width of the first opening of the first supporter pattern is smaller than a second width of the second opening of the second supporter pattern.
2. The semiconductor device of claim 1, wherein a first distance between the first structure and the second structure exposed to the first opening is different from a second distance between the first structure and the second structure exposed to the second opening.
3. The semiconductor device of claim 2, wherein the first distance is greater than the second distance.
4. The semiconductor device of claim 1, wherein a first distance between the first structure and the second structure exposed to the first opening is substantially equal to a second distance between the first structure and the second structure exposed to the second opening.
5. The semiconductor device of claim 1, wherein the first supporter pattern and the second supporter pattern contain different materials from each other.
6. The semiconductor device of claim 5, wherein the first supporter pattern contains SiCN and the second supporter pattern contains SiN.
7. The semiconductor device of claim 1, further comprising:
a third structure spaced from the second structure in the first direction; and
a fourth structure, a fifth structure and a sixth structure respectively spaced from the first structure, the second structure and the third structure in a second direction having an acute angle to the first direction,
wherein the first opening is one of a plurality of first openings of the first supporter pattern,
wherein the second opening is one of a plurality of second openings of the second supporter pattern,
wherein the plurality of first openings and the plurality of second openings expose portions of sidewalls of the first structure, the second structure, the third structure, the fourth structure, the fifth structure and the sixth structure, and
wherein portions of sidewalls of the first structure, the second structure, the third structure, the fourth struc- ture, the fifth structure and the sixth structure are covered by the first supporter pattern and the second supporter pattern.

8. The semiconductor device of claim 1, further comprising:
a third structure spaced from the second structure in the first direction; and
a fourth structure, a fifth structure and a sixth structure respectively spaced from the first structure, the second structure and the third structure in a third direction perpendicular to the first direction,
wherein the first opening is one of a plurality of first openings of the first supporter pattern,
wherein the second opening is one of a plurality of second openings of the second supporter pattern,
wherein the plurality of first openings and the plurality of second openings expose sidewalls of the first structure, the second structure, the third structure, the fourth structure, the fifth structure and the sixth structure, and
wherein portions of sidewalls of the first structure, the second structure, the third structure, the fourth structure, the fifth structure and the sixth structure are covered by the first supporter pattern and the second supporter pattern.

9. The semiconductor device of claim 1, wherein each of the first structure and the second structure has one from among a cylindrical shape and a pillar shape.

10. The semiconductor device of claim 1, further comprising:
a first capacitor dielectric film disposed on the first lower electrode;
a second capacitor dielectric film disposed on the second lower electrode;
a first upper electrode disposed on the first capacitor dielectric film; and
a second upper electrode disposed on the second capacitor dielectric film.

11. A semiconductor device, comprising:
a substrate;
a first structure disposed on the substrate and including a first lower electrode;
a second structure spaced from the first structure on the substrate in a first direction and including a second lower electrode;
a third structure spaced from the first structure on the substrate in a second direction different from the first direction and including a third lower electrode;
a first supporter pattern disposed on the substrate to support the first structure, the second structure and the third structure, the first supporter pattern defining a first opening that exposes first portions of sidewalls of the first structure, the second structure and the third structure and covering second portions of sidewalls of the first structure, the second structure and the third structure; and
a second supporter pattern disposed on the first supporter pattern to support the first structure, the second structure and the third structure, the second supporter pattern defining a second opening that exposes third portions of sidewalls of the first structure, the second structure and the third structure and covering fourth portions of sidewalls of the first structure, the second structure and the third structure, and the second structure containing a different material from the first supporter pattern,
wherein a first length of a first supporter pattern sidewall disposed between the first structure and the second structure is different from a second length of a second supporter pattern sidewall disposed between the first structure and the second structure.

12. The semiconductor device of claim 11, wherein a second sidewall of the first supporter pattern that defines the first opening is formed along a first circular arc corresponding to a first center of the first opening, and
wherein a fourth sidewall of the second supporter pattern that defines the second opening is formed along a second circular arc corresponding to a second center of the second opening.

13. The semiconductor device of claim 12, wherein a first radius of the first circular arc is smaller than a second radius of the second circular arc.

14. The semiconductor device of claim 11, wherein a first angle formed by the first direction and the second direction is an acute angle.

15. The semiconductor device of claim 11, wherein a first angle formed by the first direction and the second direction is 90°.

16. A semiconductor device, comprising:
a substrate;
a first structure, a second structure and a third structure spaced apart from each other on the substrate, the first structure including a first lower electrode and the second structure including a second lower electrode and the third structure including a third lower electrode;
a first supporter pattern disposed on the substrate to support the first structure, the second structure and the third structure, the first supporter pattern defining a first opening that exposes first portions of sidewalls of the first structure, the second structure and the third structure; and
a second supporter pattern disposed on the first supporter pattern to support the first structure, the second structure and the third structure, the second supporter pattern defining a second opening that exposes second portions of sidewalls of the first structure, the second structure and the third structure, and the second supporter pattern containing a different material from the first supporter pattern,
wherein a first width of the first opening of the first supporter pattern is smaller than a second width of the second opening of the second supporter pattern.

17. The semiconductor device of claim 16, wherein a first length of a first supporter pattern sidewall disposed between the first structure and the second structure is different from a second length of a second supporter pattern sidewall disposed between the first structure and the second structure.

18. The semiconductor device of claim 16, wherein a first distance between the first structure and the second structure exposed to the first opening is greater than a second distance between the first structure and the second structure exposed to the second opening.

19. The semiconductor device of claim 16, wherein a first sidewall of the first supporter pattern that defines the first opening is formed along a first circular arc corresponding to a first center of the first opening, and
wherein a second sidewall of the second supporter pattern that defines the second opening is formed along a second circular arc corresponding to a second center of the second opening.

20. The semiconductor device of claim 16, wherein a first sidewall of the first supporter pattern that defines the first opening is formed along a first line, and wherein a second sidewall that defines the second opening of the second supporter pattern is formed along a second line parallel to the first line.

* * * * *